United States Patent
Krueger et al.

(10) Patent No.: US 12,094,891 B2
(45) Date of Patent: Sep. 17, 2024

(54) HIGH-DENSITY CAPACITOR FOR FOCAL PLANE ARRAYS

(71) Applicant: DRS Network & Imaging Systems, LLC, Melbourne, FL (US)

(72) Inventors: Eugene E. Krueger, Allen, TX (US); Sameer K. Ajmera, Richardson, TX (US)

(73) Assignee: DRS NETWORK & IMAGING SYSTEMS, LLC, Melbourne, FL (US)

( * ) Notice: Subject to any disclaimer, the term of this patent is extended or adjusted under 35 U.S.C. 154(b) by 374 days.

(21) Appl. No.: 17/244,679

(22) Filed: Apr. 29, 2021

(65) Prior Publication Data

US 2022/0013555 A1    Jan. 13, 2022

Related U.S. Application Data

(60) Provisional application No. 63/051,028, filed on Jul. 13, 2020.

(51) Int. Cl.
*H01L 29/66* (2006.01)
*H01L 27/146* (2006.01)
*H01L 49/02* (2006.01)

(52) U.S. Cl.
CPC ........ *H01L 27/14603* (2013.01); *H01L 28/91* (2013.01)

(58) Field of Classification Search
CPC ............. H01L 27/146; H01L 27/14601; H01L 27/14603; H01L 27/14609;
(Continued)

(56) References Cited

U.S. PATENT DOCUMENTS

| 5,128,534 A | 7/1992 | Wyles et al. |
| 5,414,588 A | 5/1995 | Barbee et al. |

(Continued)

FOREIGN PATENT DOCUMENTS

| EP | 1326278 | 7/2003 |
| WO | 2013155145 | 10/2013 |

OTHER PUBLICATIONS

U.S. Appl. No. 13/859,874, Notice of Allowance, Mailed on Jul. 21, 2014, 7 pages.

(Continued)

*Primary Examiner* — Ismail A Muse
(74) *Attorney, Agent, or Firm* — Kilpatrick Townsend & Stockton LLP

(57) ABSTRACT

A photodetector structure includes a readout integrated circuit (ROIC) substrate and a dielectric layer overlaying the IC substrate. The dielectric layer defines a plurality of recesses formed in a top surface of the dielectric layer where each recess has at least one sidewall that extends from a top surface of the dielectric layer to a bottom portion of each respective recess. A capacitor structure forms a portion of the photodetector structure and includes a first electrode formed across the top surface of the dielectric layer and across the at least one sidewall of each recess of the plurality of recesses. A capacitor dielectric layer is formed across the first electrode and a second electrode is formed across the capacitor dielectric layer. A detector overlays the capacitor structure.

15 Claims, 9 Drawing Sheets

(58) Field of Classification Search
CPC ......... H01L 27/14665; H01L 27/14669; H01L 28/00; H01L 28/40; H01L 28/60; H01L 28/82; H01L 28/90; H01L 28/91; H01L 31/00; H01L 31/02; H01L 31/0224; H01L 49/00; H01L 49/02; H04N 5/00; H04N 5/33; H04N 5/335; H04N 5/3745; H10K 30/00; H10K 10/80; H10K 10/82; G01J 1/00; G01J 1/42; G01J 1/44; G01J 1/46
USPC ........................................................ 257/534
See application file for complete search history.

(56) References Cited

U.S. PATENT DOCUMENTS

| | | |
|---|---|---|
| 5,962,856 A | 10/1999 | Zhao et al. |
| 6,531,700 B1 | 3/2003 | Brown et al. |
| 7,218,048 B2 | 5/2007 | Choi et al. |
| 7,459,686 B2 | 12/2008 | Syllaios et al. |
| 7,551,059 B2 | 6/2009 | Farrier |
| 8,895,343 B2 | 11/2014 | Peterson et al. |
| 10,121,912 B2 | 11/2018 | Peterson et al. |
| 2004/0099886 A1 | 5/2004 | Rhodes et al. |
| 2004/0126963 A1* | 7/2004 | Lee ..................... H10B 12/318 257/E21.018 |
| 2007/0069258 A1 | 3/2007 | Ahn et al. |
| 2007/0138397 A1 | 6/2007 | Zelakiewicz et al. |
| 2007/0153109 A1 | 7/2007 | Lule |
| 2007/0285545 A1 | 12/2007 | Hsieh et al. |
| 2008/0079704 A1 | 4/2008 | Joshi et al. |
| 2009/0065871 A1* | 3/2009 | Lin ..................... H01L 23/3192 257/E27.06 |
| 2009/0179296 A1 | 7/2009 | Rhodes et al. |
| 2010/0044552 A1 | 2/2010 | Chen |
| 2010/0091428 A1 | 4/2010 | Kim et al. |
| 2010/0140732 A1 | 6/2010 | Eminoglu et al. |
| 2010/0327409 A1 | 12/2010 | Kume et al. |
| 2012/0043637 A1 | 2/2012 | King et al. |
| 2014/0042607 A1 | 2/2014 | Knickerbocker |
| 2014/0084407 A1* | 3/2014 | Churchwell ........ H01L 27/1469 257/443 |
| 2014/0138786 A1* | 5/2014 | Peterson ........... H01L 27/14649 257/432 |
| 2014/0159201 A1* | 6/2014 | Keller ................. H01L 23/5223 257/532 |
| 2015/0035108 A1 | 2/2015 | Peterson et al. |
| 2015/0221718 A1* | 8/2015 | Rhie .................... H10B 12/318 438/386 |
| 2015/0319386 A1* | 11/2015 | Brady ............... H01L 27/14638 348/302 |
| 2016/0155698 A1* | 6/2016 | Koo ...................... H01L 21/288 257/532 |
| 2016/0190188 A1* | 6/2016 | Murakami ........ H01L 27/14609 250/214 A |
| 2019/0035880 A1* | 1/2019 | Voiron ................ H01L 29/0657 |
| 2019/0252488 A1 | 8/2019 | Koyanagi et al. |
| 2020/0111831 A1* | 4/2020 | Choi ................. H01L 27/14627 |
| 2020/0127029 A1* | 4/2020 | Meynants ......... H01L 27/14636 |
| 2021/0013253 A1* | 1/2021 | Takase ............. H01L 27/14665 |
| 2021/0057469 A1* | 2/2021 | Huang ................ H01L 21/8234 |
| 2021/0118618 A1* | 4/2021 | Shin ....................... H01G 4/005 |
| 2022/0028916 A1* | 1/2022 | Tomekawa ........ H01L 27/14636 |

OTHER PUBLICATIONS

U.S. Appl. No. 14/519,486, Non-Final Office Action, Mailed on Sep. 11, 2017, 6 pages.
U.S. Appl. No. 14/519,486, Notice of Allowance, Mailed on Apr. 3, 2018, 5 pages.
U.S. Appl. No. 14/519,486, Notice of Allowance, Mailed on Jul. 18, 2018, 5 pages.
U.S. Appl. No. 14/519,486 "Restriction Requirement", Feb. 25, 2016, 8 pages.
Application No. EP13776 349.6, Notice of Decision to Grant, Mailed On Oct. 11, 2018, 2 pages.
Application No. EP13776349.6, Extended European Search Report, Mailed on Nov. 2, 2015, 7 pages.
Application No. PCT/US2013/035912, International Search Report & Written Opinion, Mailed on Jul. 24, 2013, 11 pages.
Tennant et al., "Advanced Wide FOV Architecture for Image reconstruction and Exploitation—AWARE-Lambda Scale", Teledyne Imaging Sensors,, Feb. 2011, 12 pages.
Tennant et al., "Advanced Wide FOV Architecture for Image reconstruction and Exploitation—AWARE-Lambda Scale, An Update", Teledyne Imaging Sensors,, Mar. 2012, 8 pages.
Application No. PCT/US2021/030143, International Search Report and Written Opinion, Mailed on Aug. 10, 2021, 7 pages.
Application No. EP21843390.2, Extended European Search Report, Mailed On May 28, 2024, 6 pages.

* cited by examiner

HIGH-DENSITY CAPACITOR FOR FOCAL PLANE ARRAYS

CROSS-REFERENCES TO RELATED APPLICATIONS

This application claims priority to U.S. Provisional Patent Application No. 63/051,028, filed Jul. 13, 2020, the disclosure of which is incorporated by reference herewith.

BACKGROUND OF THE INVENTION

As photodetector technology continues to develop, new designs can provide vastly improved resolution as compared to technology of the past. Resolution for photodetectors is at least partially determined by the number of pixels in the detector array. Typically, the more pixels in the detector array, the more detail that can be provided during imaging operations. Improved technologies have enabled manufacturing operations to produce pixels of much smaller size in order to maintain the overall form factors of the detector array, while incorporating more pixels to provide the improved resolution.

Despite the progress made in detector arrays, there is a need in the art for improved methods and systems related to detector arrays.

SUMMARY OF THE INVENTION

The present technology relates to photodetector devices and processes. More specifically, the present technology relates to photodetector structures including high-density integration capacitors.

In some embodiments a photodetector comprises a semiconductor layer having one or more integrated electrical components and a topmost metal layer. An electrically insulative layer overlays the semiconductor layer and defines a plurality of recesses formed in a first surface of the electrically insulative layer, wherein each recess of the plurality of recesses includes at least one sidewall that extends from the first surface to a bottom portion of the respective recess. A capacitor structure is coupled to one or more of the integrated electrical components and includes: a first electrode formed across the first surface of the electrically insulative layer and along the at least one sidewall of each recess of the plurality of recesses, a capacitor dielectric layer formed over the first electrode and a second electrode formed over the capacitor dielectric layer. A detector overlays the capacitor structure.

In some embodiments the electrically insulative layer comprises a passivation layer formed on the semiconductor layer as a part of an integrated circuit substrate. In various embodiments the electrically insulative layer comprises a dielectric layer that is positioned between the semiconductor layer and the detector. In some embodiments a first portion of the electrically insulative layer is positioned between the capacitor structure and the detector and a second portion of the electrically insulative layer is positioned between the capacitor structure and the semiconductor layer. In some embodiments the plurality of recesses comprise partial vias. In various embodiments the plurality of recesses comprise trenches. In some embodiments the capacitor structure comprises a first capacitor structure and a second capacitor structure is formed in a dielectric layer and is positioned between the first capacitor structure and the detector.

In some embodiments a photodetector structure comprises a semiconductor layer including an outer metal layer and an electrically insulative layer overlaying the semiconductor layer and defining a plurality of recesses formed in a top surface of the electrically insulative layer. A capacitor structure includes a first electrode formed across the top surface of the electrically insulative layer and within the plurality of recesses. A capacitor dielectric layer is formed across the first electrode and a second electrode is formed across the capacitor dielectric layer. A detector overlays the capacitor structure.

In some embodiments the electrically insulative layer comprises a passivation layer formed on the semiconductor layer. In various embodiments the electrically insulative layer comprises a dielectric layer that is positioned between the semiconductor layer and the detector. In some embodiments a first portion of the electrically insulative layer is positioned between the capacitor structure and the detector and a second portion of the electrically insulative layer is positioned between the capacitor structure and the semiconductor layer. In various embodiments the plurality of recesses comprise partial vias. In some embodiments the plurality of recesses comprise trenches.

In some embodiments the capacitor structure comprises a first capacitor structure and a second capacitor structure is formed in a dielectric layer and is positioned between the first capacitor structure and the detector. In various embodiments the second capacitor structure comprises a planar capacitor.

In some embodiments a capacitor is formed within a focal plane array unit cell, the capacitor comprising an electrically insulative layer defining a plurality of recesses formed in a first surface of the electrically insulative layer, wherein the electrically insulative layer is formed above a top metal layer of a semiconductor substrate. A first electrode is formed across the first surface of the electrically insulative layer and within the plurality of recesses. A capacitor dielectric layer is formed across the first electrode and a second electrode is formed across the capacitor dielectric layer.

In some embodiments the electrically insulative layer comprises a passivation portion of an integrated circuit substrate. In various embodiments the electrically insulative layer comprises a dielectric layer that is positioned between a readout integrated circuit device and a detector. In some embodiments the plurality of recesses comprise partial vias. In various embodiments the plurality of recesses comprise trenches.

Numerous benefits are achieved by way of the present invention over conventional techniques. For example, embodiments of the present invention provide the ability to increase capacitor surface area and to increase capacitance density per unit cell area. The increased capacitance density allows for smaller focal plane arrays and/or to increase the temperature and flux operational flexibility known in the art as "dynamic range" of both the focal plane array and the readout integration circuit. Increased capacitance density also enables the ability to add larger decoupling capacitance internal to the focal plane array thus relieving weight and size constraints on the focal plane dewar.

These and other embodiments of the invention along with many of its advantages and features are described in more detail in conjunction with the text below and attached figures.

In the appended figures, similar components and/or features can have the same reference label. Further, various components of the same type can be distinguished by following the reference label with a letter that distinguishes among the similar components. If only the first reference label is used in the specification, the description is applicable to any one of the similar components having the same first reference label irrespective of the letter. Figures are not drawn to scale.

DETAILED DESCRIPTION OF SPECIFIC EMBODIMENTS

The present disclosure describes techniques related generally to photodetector devices that use focal plane arrays. More specifically, techniques disclosed herein relate to high-density capacitors that are incorporated into an interlayer structure disposed between a readout integrated circuit ("ROTC") and a detector structure within a focal plane array unit cell. As described herein, as pixel sizes are reduced, there is less room for incorporation of capacitors providing integration capacitance, which can be directly related to performance of the detector array. Embodiments of the present invention provide for increased capacitance density within the unit cell of each pixel to provide the necessary integration capacitance. Various inventive embodiments are described herein, including methods, processes, systems, devices, and the like.

For example, in some embodiments a plurality of recesses are formed in a dielectric layer within the focal plane array. A capacitor structure follows the topography of the recesses and includes two electrodes separated by a dielectric layer. The undulating capacitor structure can increase a surface area of the capacitor as compared to a planar capacitor structure fit within the same planar area.

In another example, additional layers of capacitor structures can be formed in the focal plane array where the capacitor structures can be high-density, planar, or a mix of the two types.

In some embodiments the capacitor structures can be used independently or coupled to an internal integration capacitor, while in other embodiments one or more of the capacitor structures can be used for other purposes, such as a decoupling or bypass capacitors.

In order to better appreciate the features and aspects of high-density capacitor structures for focal plane arrays according to the present disclosure, further context for the disclosure is provided in the following section by discussing one particular implementation of a high-density capacitor structure for a focal plane array unit cell according to embodiments of the present disclosure. These embodiments are for example only and other embodiments can be employed in other focal plane array configurations.

Figure 1:
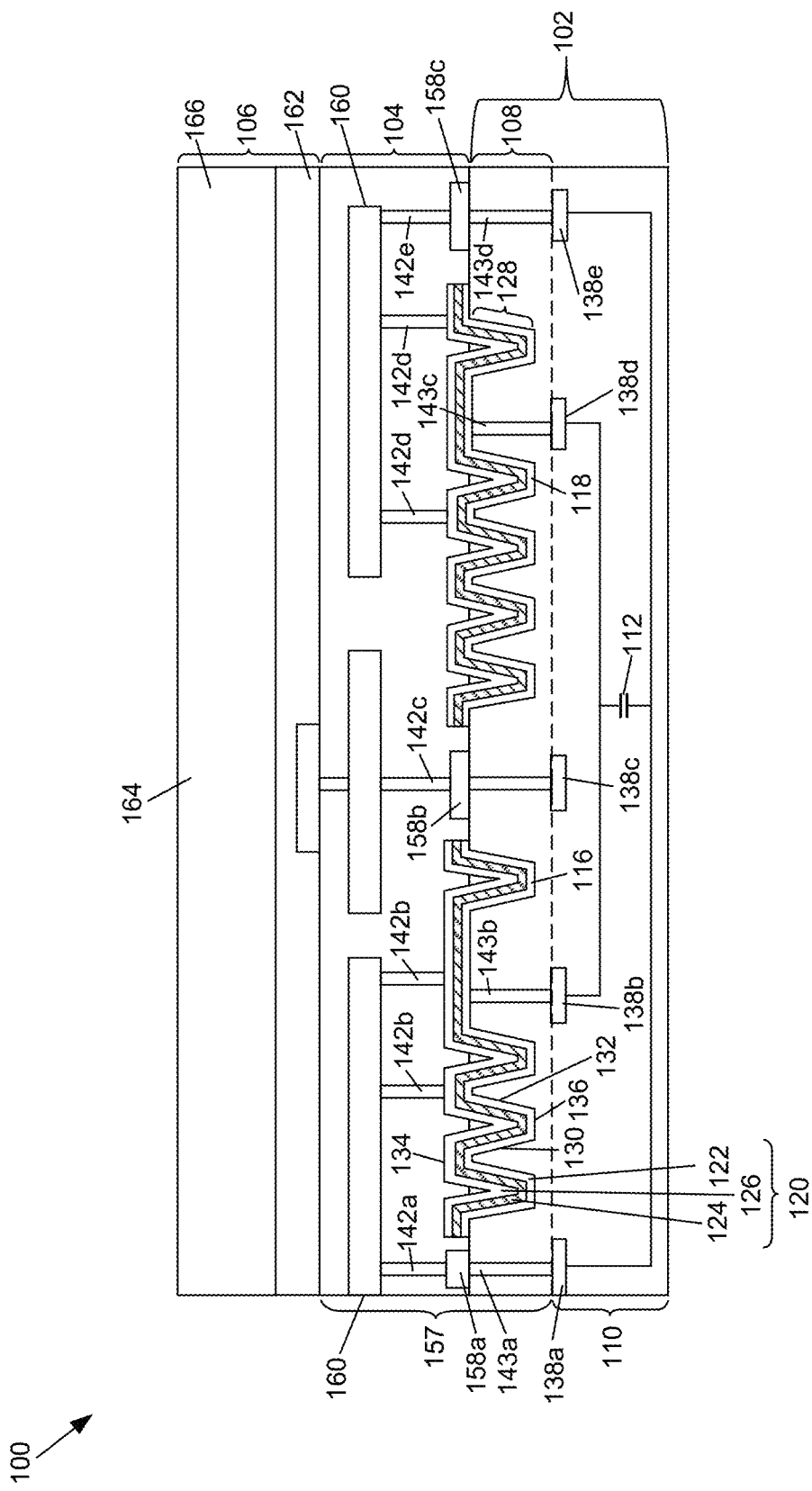
FIG. 1 is a simplified cross-sectional view of a photodetector structure with a high-density capacitor, according to embodiments of the disclosure.

FIG. 1 illustrates a simplified cross-section of a focal plane array unit cell 100, according to embodiments of the disclosure. As shown in FIG. 1, unit cell 100 has three primary layers including an IC substrate 102 as a bottom layer, a dielectric layer 104 as a middle layer and a photodetector layer 106 as a top layer. Detector 164 is formed in photodetector layer 106 and in response to the detector detecting infrared radiation, a semiconductor layer 110 of IC substrate 102 generates and transfers a corresponding signal to one or more outputs for readout by the appropriate system electronics.

More specifically, semiconductor layer 110 generates the corresponding signal using integrated active and passive electrical components that are formed within the semiconductor layer in conjunction with first and second high-density capacitors 116, 118, respectively, that are positioned between the semiconductor layer and photodetector layer 106. In the embodiment shown in FIG. 1, first and second high-density capacitors 116, 118, respectively, are formed using a plurality of recesses 128 that are positioned in passivation portion 108 of IC substrate 102 and a capacitor structure 120 that follows the contours of the plurality of recesses. In one embodiment, plurality of recesses 128 can be in the form of partial vias (also known as blind vias) forming an arrayed cone-like topography, however other topographies can be used in other embodiments, as would be appreciated by one of skill in the art with the benefit of this disclosure. The undulating geometry of capacitor structure 120 results in an increase of the area of the capacitor structure, and in the related capacitance of first and second high-density capacitors 116, 118, respectively, as compared to a planar capacitor structure (e.g. a capacitor structure that is planar and does not follow the contours of the plurality of recesses) formed in the same planar area.

First and second high-density capacitors 116, 118 can be coupled to one or more electrical components within semiconductor layer 110 using any combination of connectors 138 *a*-138 *e*, vias 142 *a*-142 *e*, 143 *a*-143 *d*, and interlayer connectors 158 *a*-158 *c*. In the embodiment illustrated in FIG. 1, first and second high-density capacitors 116, 118, respectively, are coupled in parallel with integration capacitor 112. More specifically, integration capacitor 112 has a first electrode coupled to connectors 138 *a*, 138 *e* and a second electrode coupled to connectors 138 *b*, 138 *d*. In one embodiment, connectors 138 *a-e* are formed from a top metal layer of semiconductor layer 110. That is semiconductor layer can include a layer of semiconductor material (e.g., silicon) and can also include one or more metal layers (typically called metal 1, metal 2, etc. by those of skill in the art) separated by dielectric layers that are formed as part of the semiconductor layer. As defined herein a topmost or outer metal layer is the metal layer that is furthest away from the silicon material. Connector 138 *a* is coupled to top electrode layer 126 of first high-density capacitor 116 through via 143 *a*, interlayer connector 158 *a* and via 142 *a* that is coupled to a conductor layer 160. In some embodiments conductor layer 160 can be a relatively thick electrically conductive layer formed within dielectric layer 104. Conductor layer 160 can be coupled to vias 142b that are coupled to top electrode layer 126 of first capacitor 116. In some embodiments conductor layer 160 can be coupled to multiple locations of top electrode layer 126 to reduce a voltage potential across the top electrode and/or to electrically couple separate portions of first capacitor 116 together.

Similarly connector 138e is coupled to top electrode layer 126 of second capacitor 118 through via 143d, interlayer connector 158c and via 142e that is coupled to conductor layer 160. Conductor layer 160 can be coupled to vias 142d that are coupled to top electrode layer 126 of second high-density capacitor 118. In some embodiments conductor layer 160 can be coupled to multiple portions of top electrode of a high-density capacitor to reduce a voltage potential across the top electrode and/or to electrically couple separate portions of second capacitor together. Connector 138b is coupled to bottom electrode layer 122 of first capacitor 116 through via 143b and connector 138d is coupled to bottom electrode layer 122 of second capacitor 118 through via 143c.

Although first and second capacitors 116, 118 are illustrated in FIG. 1 as coupled in parallel with integration capacitor 112, the first and second high-density capacitors can be coupled in any other suitable configuration to any other electrical components within semiconductor layer 110. For example, in another embodiment first high-density capacitor 116 can be coupled in parallel with integration capacitor 112 and second high-density capacitor 118 can be configured for use as a decoupling capacitor. In further embodiments more than one high-density capacitor layer can be used including two, three, four or more separate high-density capacitor layers. The example of two high density capacitors represented by 116 and 118 is an example of one embodiment of the invention. Any suitable number of high-density capacitors can be formed and coupled in any suitable manner to electrical component within IC substrate 102.

In some embodiments the use of one or more high-density capacitors 116, 118 in unit cell 100 can increase the storage capacitance for a given unit cell area, enabling reductions in size and/or increasing the temperature and flux operational flexibility of both the focal plane array and IC substrate 102 as compared to unit cells that use only capacitors formed within semiconductor layer 110. In further embodiments, the use of one or more high-density capacitors 116, 118 can also provide increased ability to add decoupling capacitance internal to unit cell 100, relieving weight and size constraints on the focal plane array design. One of ordinary skill, with the benefit of this disclosure, would recognize many variations, modifications, and alternatives. These and other benefits of integrated high-density capacitors will be described in more detail below. In particular, unit cell design features, including a description related to the substrate is provided below.

In some embodiments semiconductor layer 110 of IC substrate 102 is formed from a semiconductor materials such as, for example, silicon, silicon-germanium, glass, oxides of Group 14 or Group 15 elements of the periodic table, gallium arsenide, alloys of various poor metals and non-metals including silicon and germanium, etc., or other substrates on which microfabrication can be performed.

Overlying semiconductor layer 110 is passivation portion 108 that can be any type of dielectric material. In some embodiments, passivation portion can be formed from silicon oxide, silicon nitride, oxides and/or nitrides of Group 14 or Group 15 elements of the period table, gallium arsenide, oxides or nitrides of alloys of various poor metals and non-metals including silicon and geranium or other substrates on which microfabrication can be performed. In some embodiments, passivation portion 108 can be between one angstrom to three microns in thickness and the thickness of the passivation portion can depend on the design of first and second high-density capacitors 116, 118 and other components described herein.

In some embodiments, at least a portion of high-density capacitors 116, 118 can be formed in passivation portion 108. As shown in FIG. 1, in the undulating structure of first and second high-density capacitors 116, 118, respectively, is produced by plurality of recesses 128 formed in passivation portion 108, however other embodiments can utilize recesses formed in other portions of unit cell 100, as described in more detail below. More specifically, in some embodiments at least a portion of high-density capacitors 116, 118 can be formed in dielectric layer 104 (see e.g., FIGS. 6-8), in other embodiments the entirety of the high-density capacitors can be formed in the dielectric layer. As defined herein, electrically insulative layer 157 includes any type of passivation layer 108 that can be formed as a portion of semiconductor layer 110 and/or any type of dielectric layer 104 that can be formed above IC substrate 102. In some embodiments at least a portion of high-density capacitors 116, 118 can be formed in electrically insulative layer 157.

In one embodiment, plurality of recesses 128 each include a first sidewall 130 that is coupled to a planar segment 136 that is coupled to a second sidewall 132. In some embodiments, each sidewall 130, 132 can be sloped which allows for an increase in area of capacitor structure 120. In some embodiments plurality of recesses 128 can resemble sequential trenches while in other embodiments they can resemble an array of vias or "cone-like structures" and in yet further embodiments can be rectangular resembling trenches. In some embodiments a width, and/or a diameter of each recess 128 can be between 0.1 microns and 1.0 microns, while in other embodiments can be between 0.01 and 10.0 microns. One of ordinary skill, with the benefit of this disclosure, would recognize many variations, modifications, and alternatives.

In some embodiments sidewalls 130, 132 can be created by chemical etching, ion beam milling, deep reactive ion etching (DRIE) or other suitable technique. The angle of each sidewall 130, 132 of recess 128 can vary depending on a desired density of the capacitor structure and/or on manufacturing considerations. In some embodiments, each sidewall of recess 128 can have a same and/or different slope angle than the recess structure to the right and/or left recess structure.

Typically, the angle of the slope as measured from a top surface of IC substrate 102 can vary between approximately vertical (e.g., approximately 90 degrees) to 10 degrees or less. In some embodiments, a cross-sectional profile of recess 128 can be similar in appearance as the letter U, V or W. Each sidewall 130, 132 can vary in length depending on the design of capacitor structure 135. In some embodiments, first sidewall 130 can be a same length as second sidewall 132 of a recesses 128 and in other embodiments, the first sidewall can be a different length as the second sidewall to accommodate for a different recess structure configuration.

Generally, sidewalls 130, 132 each include a top section that is coupled to planar portions 134 and a bottom section that is coupled to planar segments 136 between each sidewall. In some embodiments, sidewalls 130,132 can be formed with a uniform or smooth slope as each sidewall slopes downward or upward at a consistent rate of increase or decrease. This sidewall structure can form the appearance of a line that may assist in the formation of a uniform distribution of each layer of capacitor structure 120. In other embodiments, sidewalls 130,132 can be formed by a series of steps as each sidewall slopes downwards or upwards. The series of steps can form the appearance of a set of stairs as each sidewall extends from the respective planar portion 134 to the respective planar segment 136. In some embodiments, each step of the series of steps can be uniform in size, in terms of width and height of each step. In other embodiments, each step of the series of steps can be different in width, height, and/or shape. In some embodiments, each sidewall 130, 132 can be formed using a single etching technique while in other embodiments each sidewall can be formed using a combination of different etching techniques.

In some embodiments, capacitor structure 120 includes a bottom electrode layer 122, a dielectric material 124, and a top electrode layer 126 where each layer of the capacitor structure is stacked vertically on top of each other. More specifically, dielectric material 124 is formed on a top surface of bottom electrode layer 122 and top electrode layer 126 is formed on top surface of dielectric material 124. Each electrode layer 122, 126 can comprise one or more materials including transition metals such as titanium, or transition metal nitrides, for example, such as titanium nitride. In further embodiments electrode layers 122, 126 can comprise a conductive material that can include a metal, alloy, or other material that can include silver, nickel, copper, platinum, tungsten, iridium, ruthenium, tantalum, chromium, iron, niobium, manganese, aluminum, gallium indium tin, etc., or some combination of one or more of these or other conductive materials.

In some embodiments electrode layers 122, 126 can be formed as a thin film coating that is deposited using thin film sputtering, evaporation, or other techniques in order to create a uniform layer that can be used as an electrode for a capacitor. Each electrode layer 122, 126 can vary in thickness depending on the type of material used and the design of the high-density capacitors 116, 118. In one embodiment the equivalent series resistance design parameters of first and second high-density capacitors 116, 118 are used to select the appropriate material and thickness for electrode layers 122, 126. In some embodiments a thickness of each electrode layer 122, 126 can vary from one angstrom to 1 micron while in other embodiments each electrode layer can be a different thickness. In one embodiment, each electrode layer 122, 126 is between 50 and 4000 angstroms thick, while in another embodiment each electrode layer is between 75 and 3000 angstroms thick and in one embodiment each electrode layer is between 100 angstroms and 2000 angstroms thick.

In some embodiments electrode layers 122, 126 can include a combination of materials and can include multiple layers of material. For example, in one embodiment each electrode layer 122, 126 can be composed of at least two layers of material. Each layer of material can be the same or different from one another, and in one embodiment can include both a metal layer and a metal nitride layer. As an illustrative example, bottom electrode layer 122 can include a first layer of material that can be made from a transition metal such as titanium. Overlying this first layer of material can be a second layer of material that can be made from a transition metal nitride such as titanium nitride, for example. Top electrode layer 126 can be formed in a similar fashion or different fashion as bottom electrode layer 122. For example, in some embodiments bottom electrode layer 122 includes a first layer such as bismuth, tin, nickel titanium, aluminum or tungsten and a second layer such as bismuth oxide, tin oxide, nickel oxide, titanium nitride, aluminum nitride or tungsten oxide while top electrode layer 126 can include a reversed structure including a first layer of bismuth oxide, tin oxide, nickel oxide, titanium nitride, aluminum nitride or tungsten oxide and a second layer of bismuth, tin, nickel, titanium, aluminum or tungsten overlying the first layer. One of ordinary skill, with the benefit of this disclosure, would recognize many variations, modifications, and alternatives.

In some embodiments dielectric material 124 can include oxides of transition metals or poor or post transition metals. For example, dielectric material 124 can include titanium, zirconium, hafnium, tantalum, lanthanum, aluminum, gallium, indium, silicon and other metals that provide a suitable dielectric constant, leakage blocking, or some combination of these or other dielectric characteristics. Some embodiments can include multiple layers of dielectric material, and can have more than or about 1, 2, 3, 4, 5, 6, 7, 8, 9, 12, 15, 20, etc., or more layers of dielectric material. The layers of dielectric material can be included in alternating layers of two or more dielectrics. For example, a dielectric material 124 can include three layers of material that have bismuth oxide, hafnium oxide, tin oxide, aluminum oxide, and/or zirconium oxide in layers between electrode layers 122, 126. Alternatively, alternating layers of two materials can be used. One of ordinary skill, with the benefit of this disclosure, would recognize many variations, modifications, and alternatives. In some embodiments, a thickness of the dielectric material can be the same thickness as each electrode layer 122, 126. In other embodiments, dielectric material 124 can be thinner or thicker than each electrode layer 122, 126. The thickness of dielectric material 124 can vary depending on the design of first and second high-density capacitors 116, 118. In some embodiments dielectric material 124 can be deposited using atomic layer deposition (ALD), sputtering, chemical vapor deposition (CVD), plasma-assisted deposition or any other suitable process.

In some embodiments capacitor structure 120 can follow the topography of plurality of recesses 128 formed in passivation portion 108, however in other embodiments capacitor structure 120 can follow a topography of a portion of dielectric layer 104, as described in more detail below. In further embodiments there may be multiple layers of capacitor structure 120, some of which may follow a non-planar topography and some of which may follow a planar topography as also described in more detail below. The particular topography of capacitor structure 120 can vary for each capacitor structure and can be based upon a desired capacitance level and/or other design requirements such as, but not limited to equivalent series resistance (ESR).

In some embodiments, first high-density capacitor 116 can have a different capacitance and/or performance than second high-density capacitor 118 based on the needs of a particular unit cell 100. More specifically in some embodiments, first high-density capacitor 116 can have a relatively high-density of recesses 128 that are used to maximize the capacitance coupled in parallel with integration capacitor 112, while second high-density capacitor 118 can have a relatively low density of recesses 128 and can be used as a decoupling capacitor for unit cell 100. One of ordinary skill, with the benefit of this disclosure, would recognize many variations, modifications, and alternatives Dielectric layer 104 can be positioned between IC substrate 102 and photodetector layers 106 and can form a portion of first and second high-density capacitors 116, 118. More specifically, in some embodiments dielectric layer can be deposited after capacitor structure 120 such that the dielectric layer 104 insulates top and bottom electrodes, 122, 126, respectively, and further insulates photodetector layers 106 from other portions of unit cell 100. In some embodiments dielectric layer 104 can be an oxide, nitride, polymer or any other material that provides suitable electrical insulation within unit cell 100. In one embodiment dielectric layer 104 can be silicon dioxide, for example. In some embodiments multiple layers of capacitive structure 120 can be formed within interlayer dielectric, as described in more detail below.

In some embodiments, dielectric layer 104 can include conductor layer 160, that is insulated from photodetector layers 106 and capacitor structure 120. Conductor layer 160 can be formed using thin or thick film processes and in one embodiment is formed using an electrode plating process to deposit a metallic material. The metallic material can be deposited directly onto predetermined segments using a mask or the entire top surface of dielectric layer 104 can be covered with the metallic material and individual segments can be etched to form the desired features of conductor layer 160.

In some embodiments, conductor layer 160 can be configured to create a uniform voltage potential across electrode layers 122, 126 of capacitor structure 120. In various embodiments conductor layer 160 can have a lower electrical resistance than electrode layers 122, 126 and can be configured to reduce a voltage potential that may be formed across electrode layers 122, 126. A thickness of conductor layer 160 can vary depending on the allowable voltage potential across electrodes and/or other performance and manufacturing considerations of first and second high-density capacitors 116, 118, respective. In some embodiments, conductor layer 160 can be between 0.3 to 30 microns thick and in other embodiments can be between 0.7 and 2 microns thick and in one embodiment can be approximately 1 micron thick. In some embodiments, conductor layer 160 can be between 10 to 10,000 times thicker than electrode layers 122, 126.

Photodetector layer 106 can be formed above dielectric layer 104 and can include a reflector layer 162 that is positioned adjacent the interlayer dielectric. Reflector layer 162 can be formed from any transition or poor metal, such as titanium or aluminum, or some other metal providing a reflective coating. Reflector layer 162 can allow incident signals to detector 164 to pass through the detector multiple times in order to enhance the likelihood of detection. Reflector layer 162 can also provide an electrical connection by which a top electrode can be accessed.

A detector layer 166 can be positioned above and adjacent reflector layer 162. Detector layer 166 can be any type of photodetector material that can include photodiodes. Detector layer 166 can be in alternative embodiments a p-on-n photodiode, an n-on-p photodiode, a PIN photodiode, bolometer, etc. Detector layer 166 can be operated under a variety of bias schemes including with a high reverse bias to produce avalanche breakdown. Detector layer 166 can be formed from a variety of materials that can be utilized alone or in combination to produce a resultant bandgap as needed for various circumstances. The materials can include one or more of silicon, germanium, indium, gallium, vanadium, vanadium oxide, arsenic, mercury, cadmium, tellurium, lead, sulfur, etc. In one embodiment an example combination of materials is mercury cadmium telluride ("HgCdTe" or "MCT") that can be used in various amounts to produce resultant bandgaps between about 0 and about 1.5 eV.

Although the high-density capacitor embodiments described herein are described as being formed as a portion of a photodetector the high-density capacitor structure can be formed on any type of substrate. In particular, the capacitor structure can be formed as a discrete capacitive device, or integrated with a different type of electrical component such as a microprocessor, a power converter, a logic device or any other type of integrated circuit-based component. More specifically in one embodiment electrically insulative layer 157 can be formed on a substrate (e.g., semiconductor substrate layer 110, an organic substrate, a ceramic substrate or any other material) and capacitive structure 120 can be formed in the electrically insulative layer forming a discrete capacitor device with no integrated circuit functionality. In another embodiment semiconductor layer 110 can be a portion of a microprocessor and electrically insulative layer 157 can be formed on the semiconductor layer of the microprocessor and capacitive structure 120 can be formed in the electrically insulative layer. One of skill in the art with the benefit of this disclosure will appreciate other methods of using capacitor structure 120 as described herein.

Figure 2:
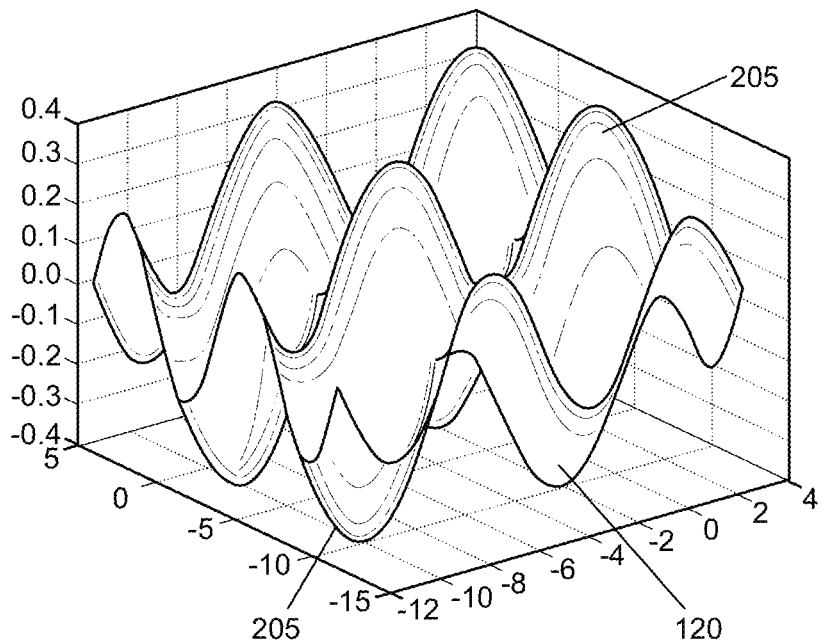
FIG. 2 is a simplified isometric view of a portion of the high-density capacitor structure illustrated in FIG. 1.

FIG. 2 illustrates an isometric view of a portion of capacitive structure 120 of first high-density capacitor 116 illustrated in FIG. 1. As shown in FIG. 2, capacitive structure 120 follows an undulating topography formed by plurality of recesses 128 (see FIG. 1), resulting in an increase in capacitance as compared to a planar structure. More specifically, the undulating topography illustrated in FIG. 2 shows a visible increase in surface area of capacitive structure 120 due to the interleaved cone-like formations 205. As described above, capacitive structure 120 includes top electrode layer 126, dielectric 124 and bottom electrode layer 122, that all follow the topography illustrated in FIG. 2. As described herein, in other embodiments capacitive structures 120 may have other configurations, geometries and shapes.

Figure 3:
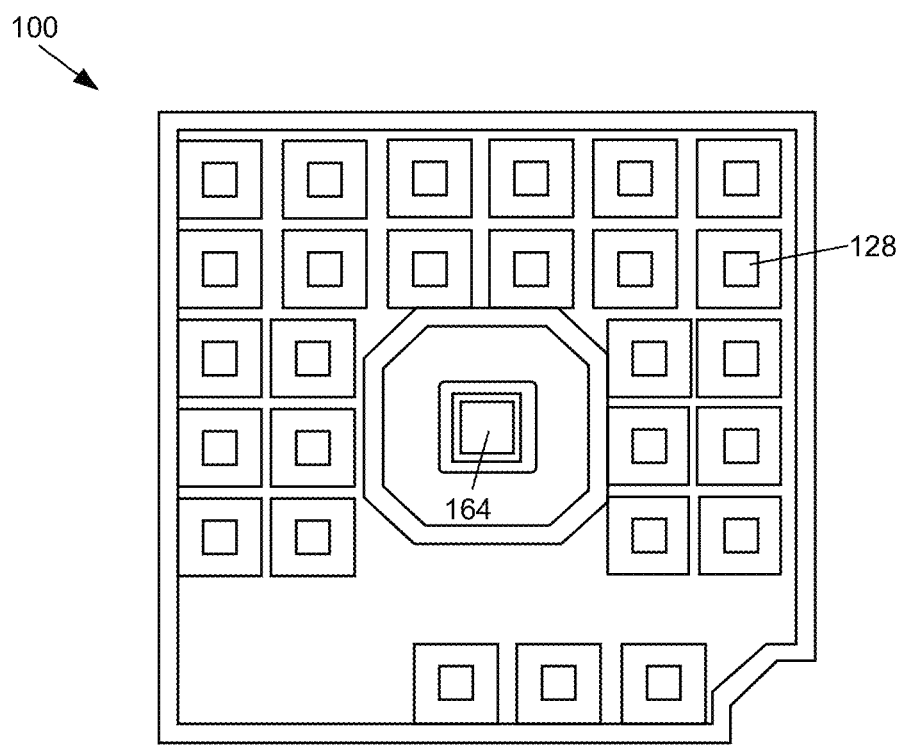
FIG. 3 is a simplified plan view of an embodiment of a focal plane array unit cell, according to embodiments of the disclosure.

FIG. 3 illustrates a simplified transparent plan view of focal plane array unit cell 100 shown in FIG. 1. As shown in FIG. 3, photodetector layer 106 is transparent and plurality of recesses 128 are arranged in an array format and are distributed across a majority of unit cell 100. In one embodiment the use of 18 to 20 recesses 128 per unit cell 100 results in 1.8 to 2.0 times the capacitor density as compared to an equivalent planar capacitor formed in the same area. As described herein, in some embodiments more than one high-density capacitor can be formed such that a portion of recesses 128 can be used for first high-density capacitor 116 (see FIG. 1) and the remaining portion of the recesses can be used for second high-density capacitor 118.

Figure 4:
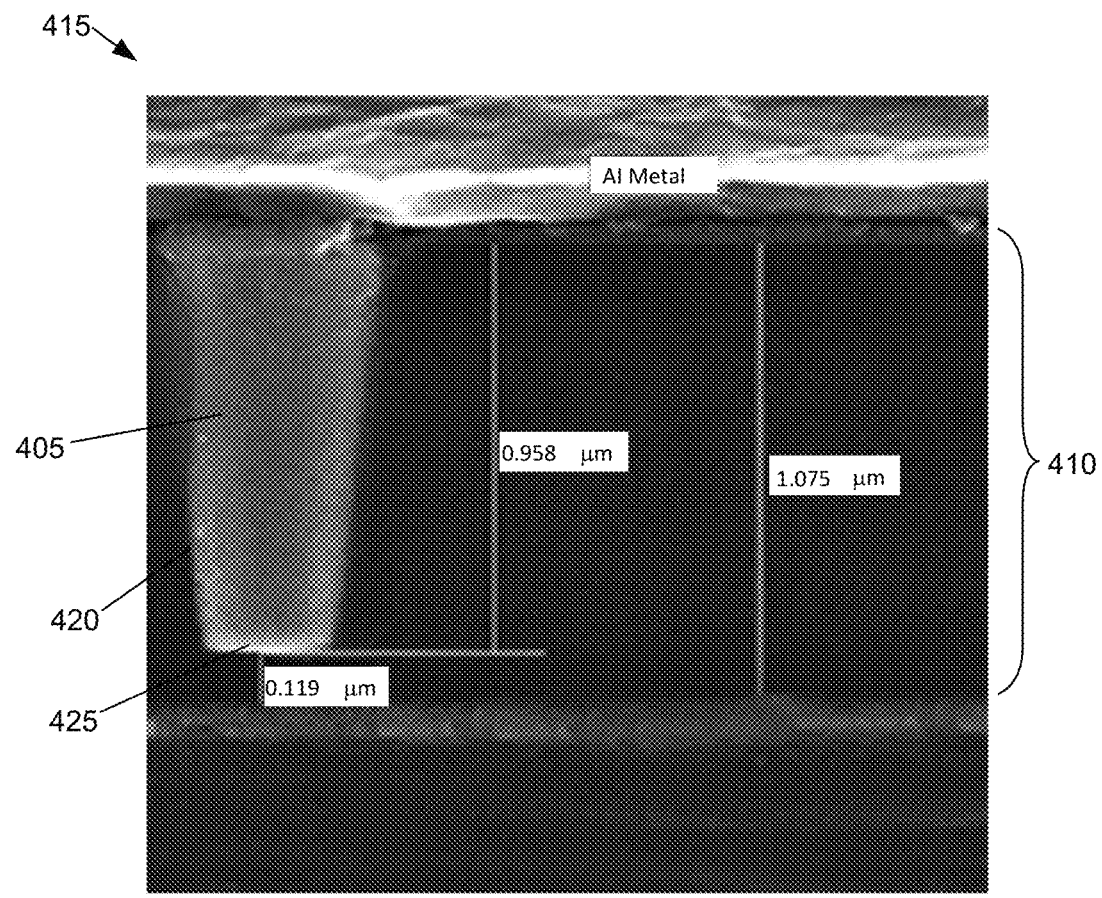
FIG. 4 is a cross-sectional view of a recess, according to embodiments of the disclosure.

FIG. 4 illustrates a partial cross-sectional view of a recess 405 formed in a passivation portion 410 of an IC substrate 415. As shown in FIG. 4, recess 405 is a partial via with slanted sidewalls 420 relatively planar bottom surface 425. In this particular embodiment, recess 405 is approximately 0.958 microns deep and is formed in passivation portion 410 that is approximately 1.075 microns thick.

Figure 5:
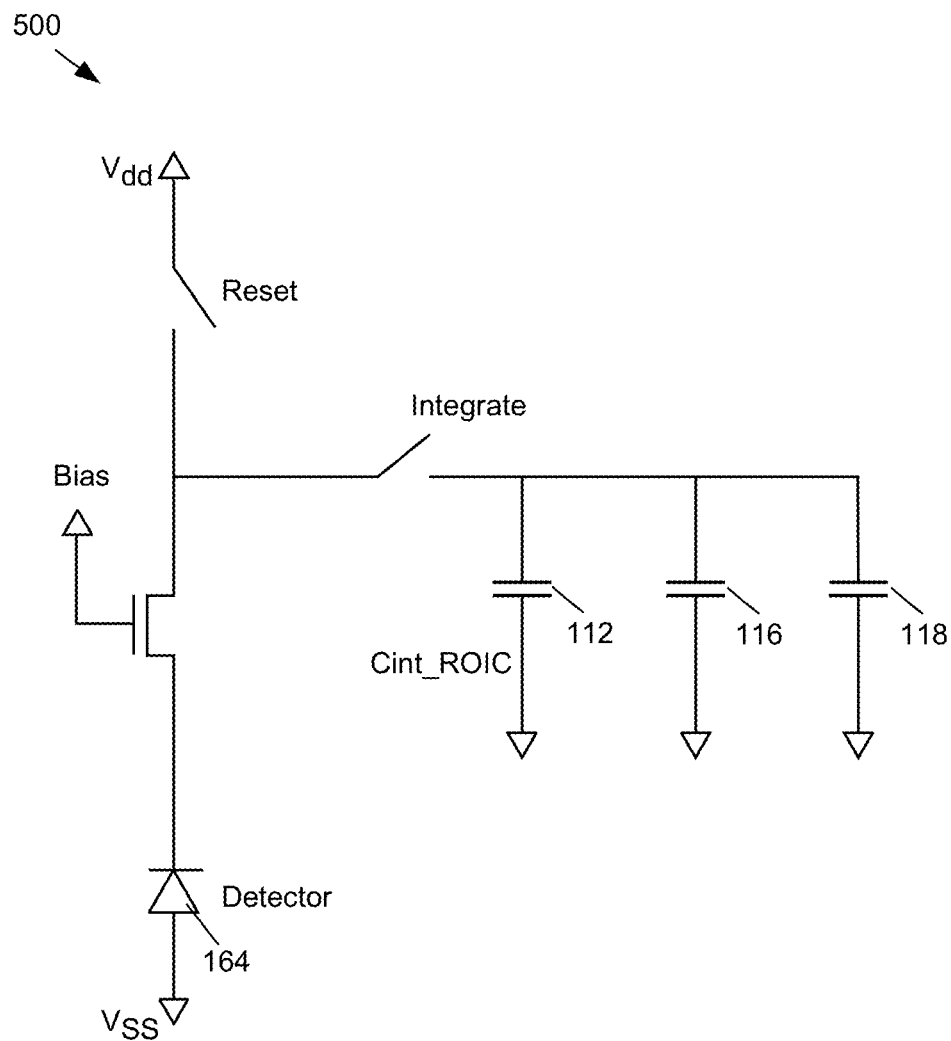
FIG. 5 is a simplified electrical circuit diagram for a focal plane array unit cell, according to embodiments of the disclosure.

FIG. 5 illustrates a simplified electrical circuit diagram 500 for unit cell 100, illustrated in FIG. 1. As shown in FIG. 5, first and second high-density capacitors 116, 118 are coupled in parallel with integration capacitor 112. Integration capacitor 112 can be coupled to detector 164. In other embodiments first and/or second high-density capacitors 116, 118 can be coupled in series with the integration capacitor 112, or coupled to other portions of unit cell circuit 100.

Detector 164 is shown with n-on-p polarity, however, the detector can also be a p-on-n photodiode, or a PIN photodiode, for example. In yet other embodiments, a different circuit design can be used to interface with other types of photodetectors such as microbolometers.

Figure 6:
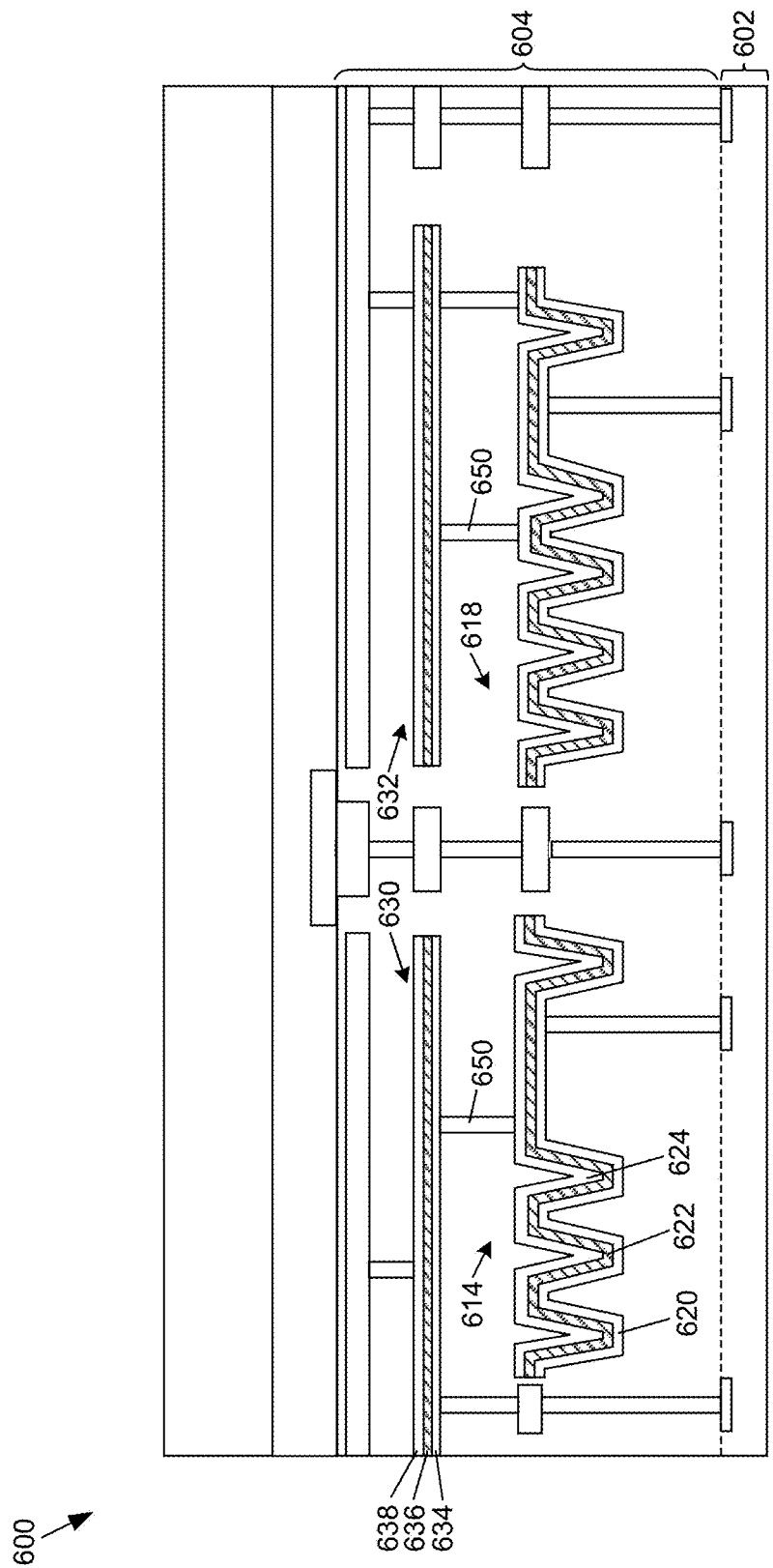
FIG. 6 is a simplified cross-sectional view of a multi-capacitor focal plane array unit cell, according to an embodiment of the disclosure.

FIG. 6 illustrates a simplified cross-sectional view of a focal plane array unit cell 600 with a multi-layered capacitor according to embodiments of the disclosure. As shown in FIG. 6, unit cell 600 is similar to unit cell 100 except unit cell 600 includes a two-layer capacitor structure stacked on top of each other enabling increased capacitor density. More specifically, unit cell 600 shows four capacitors, with capacitors 630, 632 having a planar structure and capacitors 614, 618 having a non-planar high-density structure.

High-density capacitor structures 614, 618 can include a first bottom electrode 620 and a dielectric layer 622 formed over the first bottom electrode 620. First top electrode 624 can be formed over first dielectric layer 622. A portion of dielectric layer 604 can be formed over first top electrode 624, and the dielectric layer functions as an electrical insulator between high-density capacitor structures 614, 618 and planar capacitor structures 630, 632. In some embodiments, planar capacitor structure 632 includes similar layers and materials as high-density capacitor structures 614, 618. More specifically, planar capacitor structure 632 includes a second bottom electrode 634 and a second dielectric material 636 formed over the second bottom electrode. A second top electrode 638 is formed over the second dielectric material 636. In some embodiments, high-density capacitor structures 614, 618 and planar capacitor structures 630, 632 can be electrically coupled together to act as a single capacitor. In further embodiments planar capacitor structures 630, 632 can be formed below high-density capacitors 614, 618. Dielectric layer 604 can be formed over a semiconductor substrate 602.

A person of skill in the art, with the benefit of this disclosure, will appreciate that, in other embodiments, dielectric layer 604 can include any number of layers of capacitor structures and in one embodiment can have 3, 4, 5, 6, 7, 8 or more layers of capacitor structures.

Figure 7:
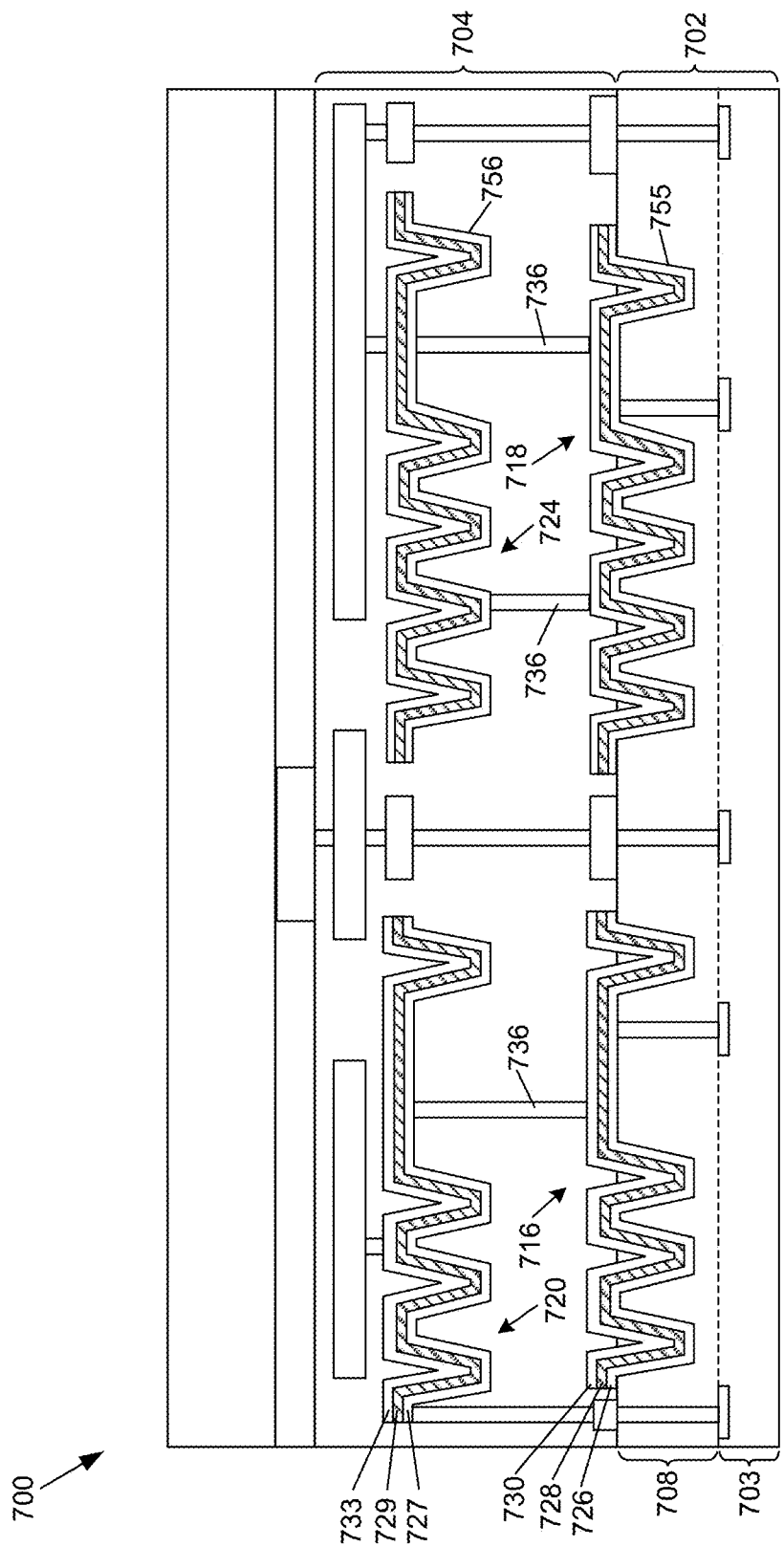
FIG. 7 is a simplified cross-sectional view of a photodetector structure with a two layer high-density capacitor, according to embodiments of the disclosure.

FIG. 7 illustrates a cross-sectional view of a focal plane array unit cell 700 multi-capacitor structure, according to embodiments of the disclosure. As shown in FIG. 7, unit cell 700 is similar to unit cell 600 shown in FIG. 6, except unit cell 700 includes a two-layer high-density capacitor structure enabling increased capacitor density. More specifically, unit cell 700 includes four capacitors in two high-density layers. A first and a second high-density capacitor 716, 718, respectively, are formed in a passivation portion 708 of ROIC 702, and a third and a fourth high-density capacitor 720, 724, respectively, are formed in dielectric layer 704. More specifically, in one embodiment passivation portion 708 can be a passivation layer that is applied over semiconductor substrate 703, where the semiconductor substrate includes a layer of semiconductor material and one or more metal layers formed as a part of the ROIC. In one embodiment passivation portion is silicon nitride that is formed as a last dielectric layer of the semiconductor fabrication process. Each high-density capacitor 716, 718, 720, 724 is similar to the high-density capacitor structures previously described and can be formed using any techniques previous disclosed.

As shown, a first and second high-density capacitors 716, 718, respectively, are formed in passivation portion 708 of IC substrate 702. First and second high-density capacitors 716, 718 both include a capacitor structure that is similar to the capacitor structures previous disclosed where a top electrode 730 is formed over a dielectric material 728 that is formed over a bottom electrode 726. The capacitor structure follows a topography created by a plurality of first recesses 755 formed in passivation portion 708.

Third and fourth high-density capacitors 720, 724 are formed in a similar manner with similar or different materials as first and second high-density capacitors 716, 718, respectively. A top electrode 733 is formed over a dielectric material 729 that is formed over a bottom electrode 727. The capacitor structure follows a topography created by a plurality of second recesses 756 formed in dielectric layer 704. In some embodiments bottom electrode 727 of third and fourth high-density capacitors 720, 724, respectively, is coupled to top electrode 730 of first and second high-density capacitors 716, 718, respectively, through one or more vias 736. The integrated capacitor structure can provide multiple capacitors per pixel with any suitable number of capacitors.

Figure 8:
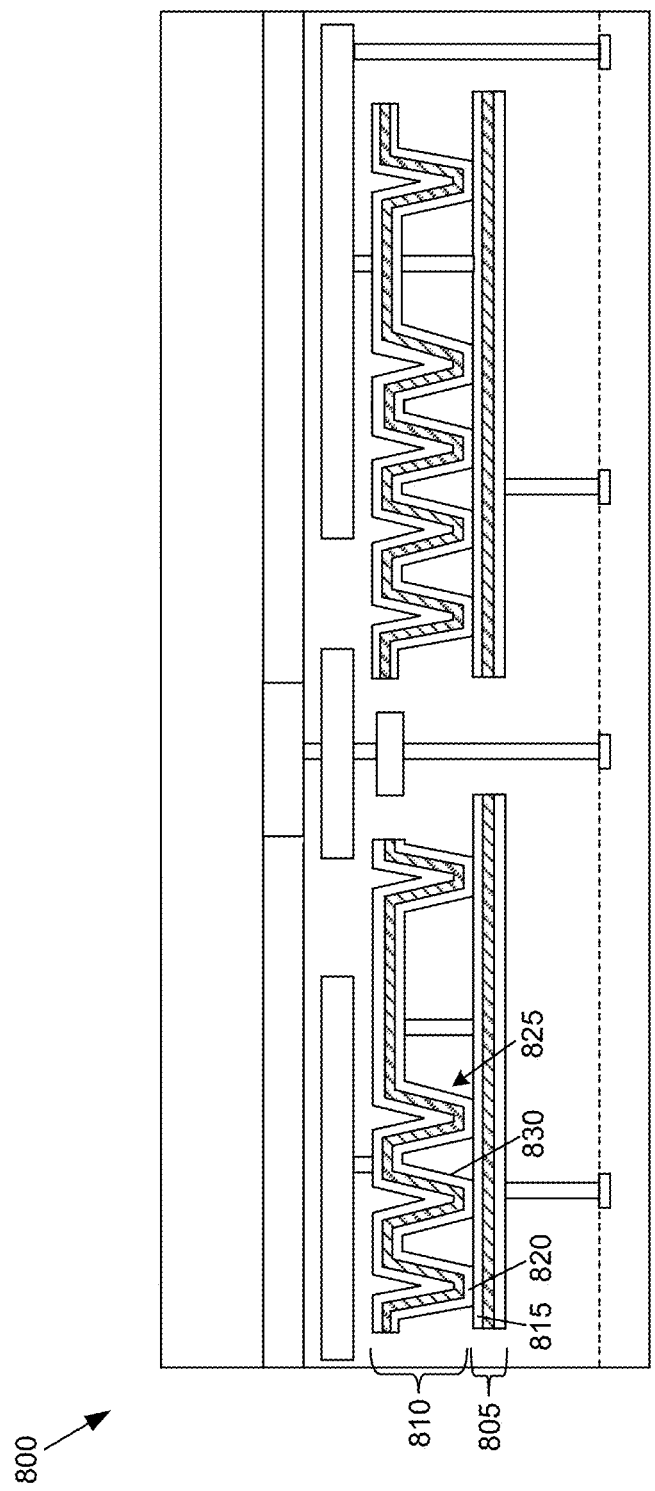
FIG. 8 is a simplified cross-sectional view of a photodetector structure with a planar and a high density capacitor structure, according to an embodiment of the disclosure.

FIG. 8 illustrates a simplified cross-sectional view of a focal plane array unit cell 800, according to embodiments of the disclosure. As shown in FIG. 8, unit cell 800 is similar to unit cell 600 of FIG. 6 where the unit cell includes both a planar capacitor 805 and a high-density capacitor 810, however in FIG. 8 the high-density capacitor is on top of and in electrical contact with the lower, planar capacitor. More specifically, in unit cell 800, a top electrode 815 of planar capacitor 805 is adjacent to and in electrical contact with a bottom electrode 820 of high-density capacitor 810. In one embodiment, bottom electrode 820 is in contact with top electrode 815 in a bottom portion 825 of each recess 830. One of ordinary skill, with the benefit of this disclosure, would recognize many variations, modifications, and alternatives.

Figure 9:
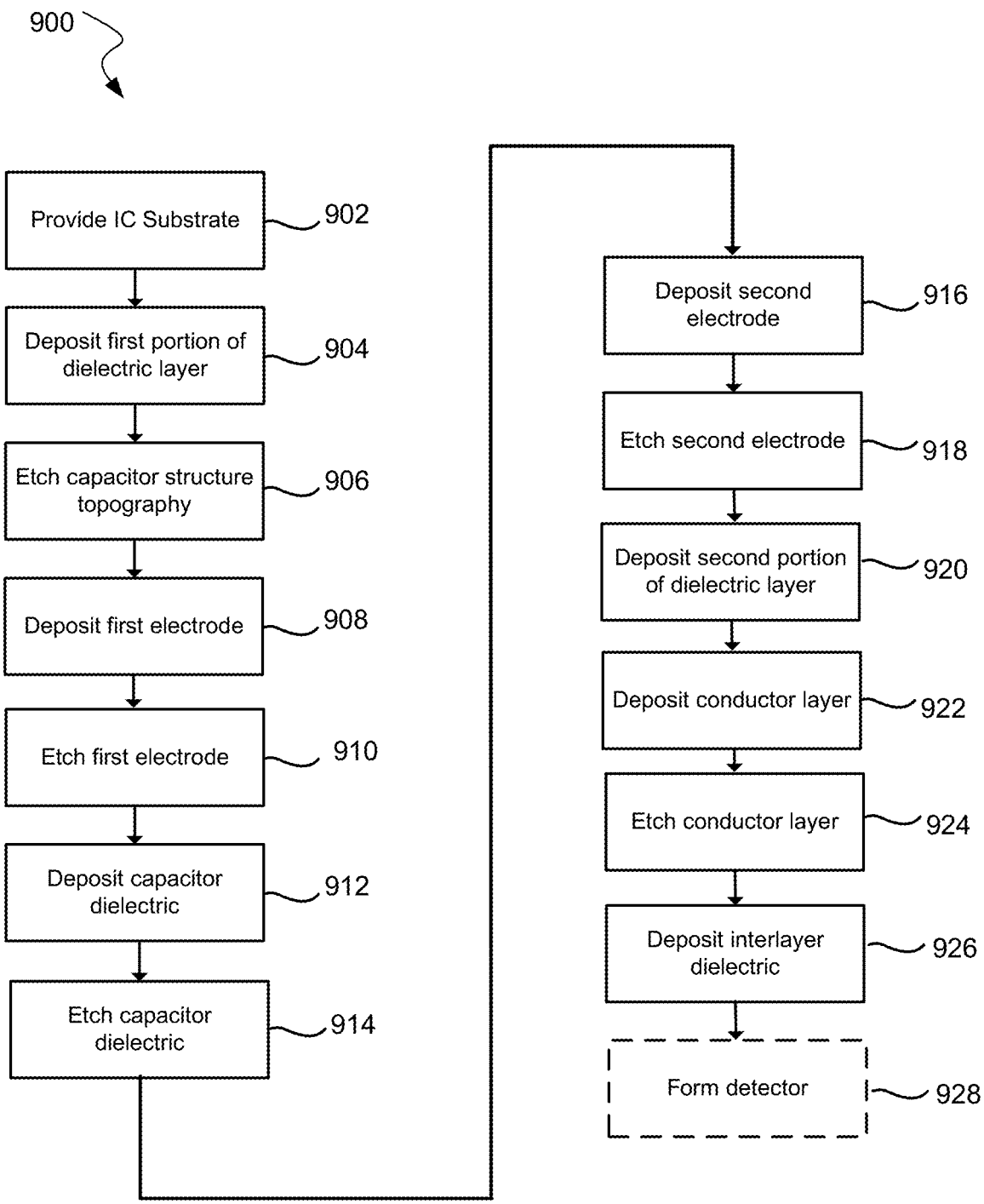
FIG. 9 is a method of forming a high-density capacitor focal plane array unit cell according to embodiments of the disclosure.
Figure 10:
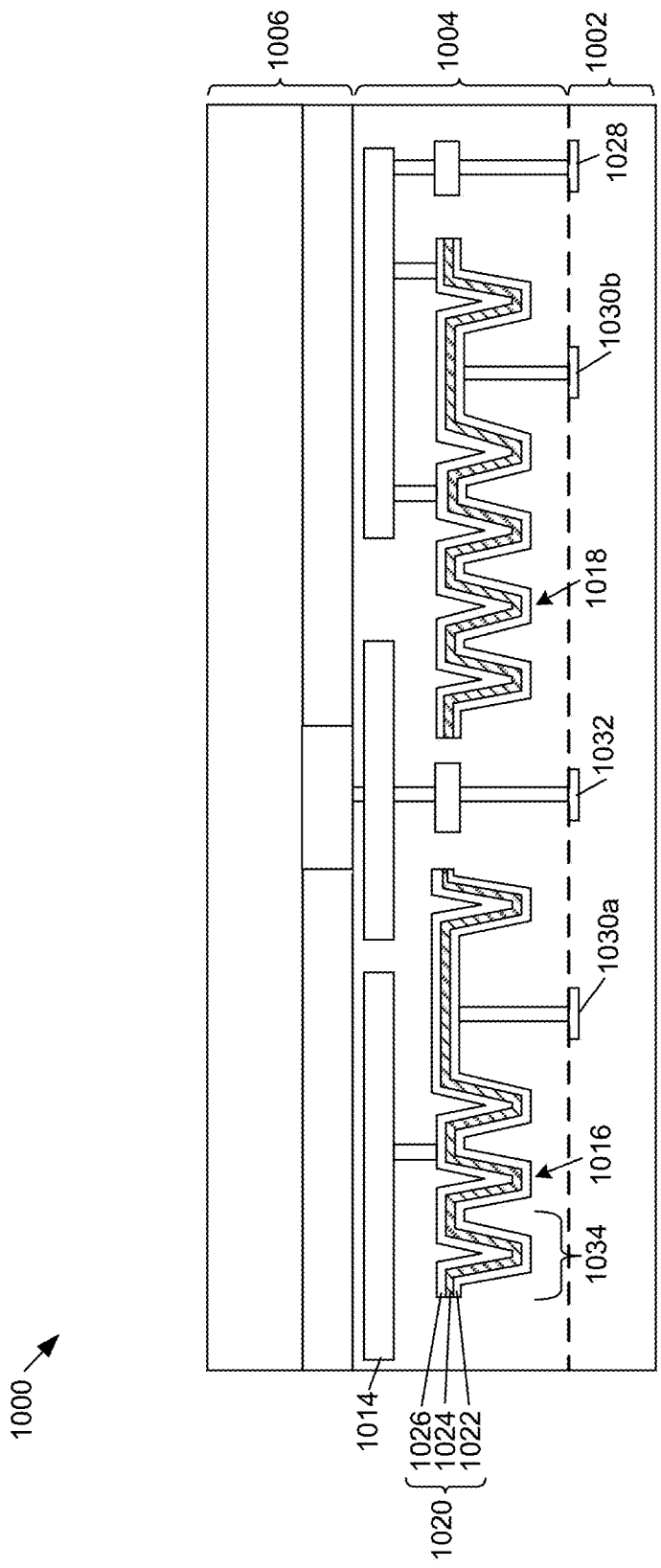
FIG. 10 is a simplified cross-sectional view of a photodetector structure with a high-density capacitor, according to embodiments of the disclosure.

FIG. 9 shows an exemplary process 900 by which a capacitor structure can be formed on or overlaying an IC substrate as shown in FIG. 10. Process 900 can be referred to as a manufacturing process. A cross-sectional view of a focal plane array unit cell 1000 is formed over a IC substrate 1002 according to the method of FIG. 9 as shown in FIG. 10. More specifically, in this particular embodiment, a high-density capacitor structure 1020 is formed in a dielectric layer 1004 that is formed on top of IC substrate 1002, however in other embodiments, as disclosed herein the high density capacitor structure can be formed using a portion of a passivation layer that is a top portion of the IC substrate.

As illustrated, an IC substrate 1002 is provided at step 902 on which a high-density capacitor structure 1016 can be formed. The IC substrate can comprise a pre-processed silicon, silicon dioxide, silicon-on-insulator, germanium, gallium arsenide, or other III-V or II-VI material.

Overlaying IC substrate 1002 is a first portion of a dielectric layer 1004 layer that is deposited onto of IC substrate at step 904. As previously described, dielectric layer 1004 is positioned between IC substrate 1002 and photodetector layers 1006 where a portion of a first and second high-density capacitors 1016, 1018 can be formed. More specifically, in some embodiments portions of dielectric layer 1004 can be deposited before, during or after capacitor structure 1020 such that the dielectric layer 1004 insulates electrode layers of high-density capacitor structure 1020 from a photodetector layers 1006 and/or from other portions of unit cell 1000. In some embodiments dielectric layer 1004 can be an oxide, nitride, polymer or any other material that provides suitable electrical insulation within unit cell 1000. In one embodiment dielectric layer 1004 can be silicon dioxide, for example. In some embodiments additional layers of capacitor structure 1016 can be formed within interlayer dielectric, as described in more detail below.

Before depositing additional layers to form high-density capacitors, a plurality of recess structures 1034 coupled together can be etched into dielectric layer 1004 at step 906, as shown in FIG. 10. As previously described, each capacitor structure 1016 is formed into a undulating and/or corrugated structure where a planar portion is coupled to a first sidewall that extends in a downward direction into a planar segment that is then coupled to a second sidewall portion that extends in a upward direction towards a second planar portion. In order to form a desired capacitor structure, this process of etching a recess structure 1034 into the dielectric layer is repeated until the desired capacitor topography can be formed. In some embodiments a via structure or any other geometry can be formed in dielectric layer 1004.

A first electrode layer 1022 can be deposited over the first portion of dielectric layer 1024 at step 908. The first electrode 1022 material can be deposited with various fabrication techniques that can include chemical vapor deposition, physical vapor deposition or sputtering, plasma enhanced chemical vapor deposition including high-density plasma deposition, low pressure or sub-atmospheric chemical vapor deposition, epitaxial growth, or atomic layer deposition. The electrode material can include a transition metal or poor metal including metal nitrides or other combinations. For example, as shown in FIG. 10, a first electrode layer 1022 can be deposited that includes titanium that is grown or deposited in dielectric layer 1004. The layer can be less than or about 1 μm in height. Alternatively the layer height can be less than or about 1 μm, 0.1 μm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, 5 angstrom, etc., or less.

In some embodiments, a second material layer is deposited over the first material layer. This second material layer can include a similar or alternative metal than the first material layer, and can include any of the materials previously described. For example, a second material layer is deposited over first material layer of first electrode 1022 that includes titanium nitride. As with the first material layer of first electrode 1022, the second material layer can be less than or about 5 μm in height. Alternatively the layer height can be less than or about 1 μm, 0.1 μm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. In alternative embodiments, additional layers material can be deposited over the first and second material layers of first electrode 1022.

One or more material layers can be deposited at a thickness and patterned to maximize current density such that the material can be ruptured during operation. For example, as shown in FIG. 10, either first material layer of first electrode 1022 can be deposited at a thickness such that a voltage exceeding a certain threshold can melt or otherwise rupture the electrode material effectively disconnecting the detector associated with the negative voltage. This feature can act as a fusing mechanism to disconnect detector pixels that have malfunctioned and can be applied to any embodiments disclosed herein After the one or more material layers of first electrode material have been deposited or grown, the first electrode structure can be etched at step 910. Etching can be performed with a wet or dry etching process that selectively removes portions of first electrode layer. A resist layer can first be deposited such that the electrode material is removed in certain portions over the substrate, but is substantially maintained in others. As shown in FIG. 10, dielectric layer 1004 material can be removed over the areas including connector 1028 for the top electrode contact, connector 1030*a*, 1030*b* for bottom electrode contacts as well as the area over connector 1032 for the detector contact. Following removal of the dielectric layer material, post-processing steps can be performed including removal of the resist material.

Over the first electrode material, a capacitor dielectric material 1024 can be deposited at step 912. The dielectric can include a metal oxide, metal nitride, metal oxynitride, metal carbide, or other known dielectric material. The metals utilized can include oxides or other formulations including silicon, aluminum, titanium, zirconium, hafnium, molybdenum, or chromium, for example. Alternative dielectric structures can include multiple layers of material to provide a combination of dielectric characteristics. For example, the layers can include more than or about 1, 2, 3, 4, 5, 6, 7, 8, 9, 10, 11, 12, 13, 15, 17, 20, 23, 25, etc., or more layers of material. The layers can include multiple materials layered in a variety of ways including alternating layers or two or more materials, or an ordered stack of materials that are then reversed and re-layered for a complete structure. As shown in FIG. 10, dielectric material 1024 is deposited in one or more layers over the layers of first electrode 1022. The layer of dielectric material can be less than or about 1 μm in height. Alternatively the layer height can be less than or about 1 μm, 0.11 μm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less. In alternative embodiments each internal layer of the dielectric material can be less than or about any of the heights listed. The total height for the layers of dielectric material can vary based on specific application requirements to preferentially minimize leakage current, maximize breakdown voltage, or maximize capacitance density.

After the one or more layers of dielectric material have been deposited or grown, the dielectric structure can be etched at step 914. The dielectric material can be etched down to the level of the first electrode material, and the etching can be performed with a wet or dry etching process that selectively removes the dielectric material in relation to the first electrode material. A resist layer can first be deposited such that the dielectric material is removed in certain portions over the substrate, but is substantially maintained in others. As shown in FIG. 10, dielectric layer 1004 material can be removed over the areas including connector 1028 for the top electrode contact, connector 1030*a*, 1030*b* for bottom electrode contact as well as the area over connector 1032 for the detector contact. Following removal of the dielectric layer material, post-processing steps can be performed including removal of the resist material.

At process step 916, a second electrode 1026 material can be deposited over capacitor structure 1016 structure overlaying first electrode 1022 and dielectric material 1024. Second electrode 1026 material can be deposited by any of the previously listed methods, and can be formed by a similar or different method than the first or bottom electrode. Additionally, second electrode 1026 material can include any one of or a combination of any of the previously listed materials. The second electrode 1026 can include one or more layers of electrode materials that can be formed in a similar manner as the first electrode. Alternatively, a different electrode material structure can be formed with the second electrode. As with the first electrode material, each one of the second electrode material layers, or the combination of materials forming the second electrode materials can have a thickness of less than about 5 µm in height. Alternatively the layer height can be less than or about 3 µm, 1 µm, 500 nm, 400 nm, 375 nm, 350 nm, 325 nm, 300 nm, 250 nm, 200 nm, 175 nm, 150 nm, 125 nm, 100 nm, 75 nm, 50 nm, 25 nm, 10 nm, 7 nm, 5 nm, 3 nm, 1 nm, 7 angstrom, etc., or less.

After the one or more layers of material are deposited for second electrode 1022, second electrode 1022 can be etched at step 918. A resist layer can first be deposited such that the electrode material is removed in certain portions over the substrate, but is substantially maintained in others. As shown in FIG. 10 dielectric layer 1004 material can be removed over the areas including connector 1028 for the top electrode contact, connector 1030 for bottom electrode contact as well as the area over connector 1028 for the detector contact. Following removal of the dielectric layer material, post-processing steps can be performed including removal of the resist material. Any etching process or combination of processes can be used to remove the materials previously deposited over the dielectric layer 1004. As illustrated in FIG. 10, each structure overlying the individual connectors 1028, 1030a, 1030b, and 1032 is isolated from one another. An additional etch process can be performed to remove the second electrode material overlying connector 1032. This additional etch process can provide additional isolation between the detector landing connections and the capacitor structure. In some embodiments a greater number or a fewer number of etches can be performed. In one embodiment one etch process can be used to simultaneously etch multiple layers.

At step 920 a second portion of dielectric layer 1004 can be deposited. In some embodiments the second portion of dielectric layer 1004 comprises the same dielectric material that was deposited in step 904. As previously disclosed, dielectric layer 1004 can be an insulating material such as silicon dioxide, or some other insulating material as previously described, or as can otherwise be used for isolating the structures overlying the IC substrate or capacitor structure 1020 formed in another portion of dielectric layer 1004. The dielectric layer 1004 can be deposited by any of the methods as previously described, and can be deposited by plasma enhanced chemical vapor deposition in one example. As shown in FIG. 10, the dielectric layer 1004 is deposited to fully isolate the regions below and above capacitor structure 1020. In some embodiments multiple deposition and/or etching steps can be performed to ensure proper step coverage of capacitor structure 1020, and dielectric layer 1004 material can be removed over the areas including connector 1028 for the top electrode contact, connector 1030a, 1030b for bottom electrode contact as well as the area over connector 1032 for the detector contact.

A conductor layer 1014 can be deposited at step 922 and etched at step 924 to provide uniform voltage potential across an electrode layer of the underlying capacitor structures while maintaining adequate isolation of the structures from one another. Conductor layer 1014 is formed and etched according to information previously disclosed above. A resist pattern can be deposited prior to the etching to ensure proper removal areas. Any of the previously discussed etching methods can be performed that selectively removes the conductive layer material while substantially maintaining the underlying structure.

Another portion of dielectric layer 1004 material can be deposited over the conductor layer 1014 at step 926. The dielectric layer 1004 can provide a barrier to the underlying capacitor structures and conductive layers while maintaining adequate isolation of the structures from one another. Any of the previously discussed etching methods can be performed.

After formation of the capacitor structure over the IC substrate has been performed, further processing steps can be performed. A detector layer 1006 can optionally be formed over the capacitor structure at step 928. The detector layer 1006 can be grown or formed directly over a reflector material, or can alternatively be formed separately and then connected to a reflector and capacitor structure. Post-processing including via etching can also be formed to produce the photodiode functionality. Additional isolation layers can or cannot be formed over regions of the reflector material in order to further prevent electrical connections from forming between the detector contact region and the capacitor region.

Any of the previously described processing steps, as well as additional polishing, annealing, or curing can be performed at temperatures of about 800° C. or less to protect the underlying and preformed ROIC structure. Alternatively, the processes can be performed at or below about 700° C., 600° C., 500° C., 450° C., 400° C., 350° C., 300° C., 200° C., 150° C., 100° C., etc. or less. The deposited layers of material over the ROIC with or without the detector material can have a total height of less than or about 30 µm. Alternatively, the deposited layers of material can have a total height of less than or about 7 µm, 5 µm, 3 µm, 2 µm, 1 µm, 800 nm, 750 nm, 600 nm, 500 nm, 450 nm, 400 nm, 350 nm, 300 nm, 250 nm, 200 nm, 150 nm, 100 nm, 50 nm, etc., or less.

It will be appreciated that process 900 is illustrative and that variations and modifications are possible. Steps described as sequential may be executed in parallel, order of steps may be varied, and steps may be modified, combined, added or omitted.

In the preceding description, for the purposes of explanation, numerous details have been set forth in order to provide an understanding of various embodiments of the present technology. It will be apparent to one skilled in the art, however, that certain embodiments can be practiced without some of these details, or with additional details.

Having disclosed several embodiments, it will be recognized by those of skill in the art that various modifications, alternative constructions, and equivalents can be used without departing from the spirit of the disclosed embodiments. Additionally, a number of well-known processes and elements have not been described in order to avoid unnecessarily obscuring the present technology. Accordingly, the above description should not be taken as limiting the scope of the technology.

It is noted that individual embodiments can be described as a process which is depicted as a flowchart, a flow diagram, or a block diagram. Although a flowchart can describe the method as a sequential process, many of the operations can be performed in parallel or concurrently. In addition, the order of the operations can be rearranged. A process can be terminated when its operations are completed, but could have additional steps not discussed or included in a figure. Furthermore, not all operations in any particularly described process can occur in all embodiments. A process can correspond to a method, a function, a procedure, a subroutine, a subprogram, etc.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges can independently be included or excluded in the range, and each range where either, neither, or both limits are included in the smaller ranges is also encompassed within the disclosed technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A unit cell of a focal plane array comprising:
   a semiconductor layer having one or more integrated electrical components;
   an electrically insulative layer overlaying the semiconductor layer and defining:
     a plurality of partial vias formed in a first surface of the electrically insulative layer, wherein each partial via of the plurality of partial vias includes at least one sidewall that extends from the first surface to a bottom portion of the respective partial via; and
     an interlayer connector extending through the electrically insulative layer to the semiconductor layer, wherein a first portion of the plurality of partial vias are disposed on a first side of the interlayer connector and another partial via of the plurality of partial vias is disposed on a second side of the interlayer connector;
   a capacitor structure coupled to one or more of the integrated electrical components by the interlayer connector and including:
     a first electrode formed across the first surface of the electrically insulative layer and disposed at a first distance from the semiconductor layer and along the at least one sidewall of each partial via of the plurality of partial vias;
     a capacitor dielectric layer formed over the first electrode; and
     a second electrode formed over the capacitor dielectric layer;
   a topmost metal layer disposed at a second distance from the semiconductor layer, wherein the second distance is greater than the first distance;
   a plurality of vias passing through the electrically insulative layer and positioned between the topmost metal layer and the capacitor structure, wherein the plurality of vias electrically connect the topmost metal layer to the second electrode; and
   a detector overlying the capacitor structure.

2. The unit cell of a focal plane array of claim 1 wherein the electrically insulative layer comprises a passivation layer formed on the semiconductor layer as a part of an integrated circuit substrate.

3. The unit cell of a focal plane array of claim 1 wherein the electrically insulative layer comprises a dielectric layer that is positioned between the semiconductor layer and the detector.

4. The unit cell of a focal plane array of claim 1 wherein a first portion of the electrically insulative layer is positioned between the capacitor structure and the detector and a second portion of the electrically insulative layer is positioned between the capacitor structure and the semiconductor layer.

5. The unit cell of a focal plane array of claim 1 wherein the capacitor structure comprises a first capacitor structure and wherein a second capacitor structure is formed in a dielectric layer and is positioned between the first capacitor structure and the detector.

6. A unit cell of a focal plane array comprising:
   a semiconductor layer having one or more integrated electrical components;
   an electrically insulative layer overlaying the semiconductor layer and defining:
     a plurality of partial vias formed in a top surface of the electrically insulative layer; and
     an interlayer connector extending through the electrically insulative layer to the semiconductor layer, wherein a first portion of the plurality of partial vias are disposed on a first side of the interlayer connector and another partial via of the plurality of partial vias is disposed on a second side of the interlayer connector;
   a capacitor structure coupled to one or more of the integrated electrical components by the interlayer connector and including:
     a first electrode formed across the top surface of the electrically insulative layer and disposed at a first distance from the semiconductor layer and within the plurality of partial vias;
     a capacitor dielectric layer formed across the first electrode; and
     a second electrode formed across the capacitor dielectric layer;
   an outer metal layer disposed at a second distance from the semiconductor layer, wherein the second distance is greater than the first distance;
   a plurality of vias passing through the electrically insulative layer and positioned between the outer metal layer and the capacitor structure, wherein the plurality of vias electrically connect the outer metal layer to the second electrode; and
   a detector overlying the capacitor structure.

7. The unit cell of a focal plane array of claim 6 wherein the electrically insulative layer comprises a passivation layer formed on the semiconductor layer.

8. The unit cell of a focal plane array of claim 6 wherein the electrically insulative layer comprises a dielectric layer that is positioned between the semiconductor layer and the detector.

9. The unit cell of a focal plane array of claim 6 wherein a first portion of the electrically insulative layer is positioned between the capacitor structure and the detector and a second portion of the electrically insulative layer is positioned between the capacitor structure and the semiconductor layer.

10. The unit cell of a focal plane array of claim 6 wherein the capacitor structure comprises a first capacitor structure and wherein a second capacitor structure is formed in a dielectric layer and is positioned between the first capacitor structure and the detector.

11. The unit cell of a focal plane array of claim 10 wherein the second capacitor structure comprises a planar capacitor.

12. A capacitor formed within a focal plane array unit cell, the capacitor comprising:
  an electrically insulative layer defining:
    a first plurality of vias formed in a first surface of the electrically insulative layer, wherein the electrically insulative layer is formed above a semiconductor substrate having one or more integrated electrical components;
    an interlayer connector extending through the electrically insulative layer to the one or more integrated electrical components of the semiconductor substrate and connecting the capacitor to the one or more integrated electrical components, wherein a first portion of the first plurality of vias are disposed on a first side of the interlayer connector and another via of the first plurality of vias is disposed on a second side of the interlayer connector;
    a first electrode formed across the first surface of the electrically insulative layer and disposed at a first distance from the semiconductor substrate and within the first plurality of vias;
    a capacitor dielectric layer formed across the first electrode;
    a second electrode formed across the capacitor dielectric layer; and
    a second plurality of vias passing through the electrically insulative layer and positioned between a topmost metal layer formed above the semiconductor substrate at a second distance greater than the first distance and the second electrode, wherein the second plurality of vias electrically connect the topmost metal layer to the second electrode.

13. The capacitor of claim 12 wherein the electrically insulative layer comprises a passivation portion of an integrated circuit substrate.

14. The capacitor of claim 12 wherein the electrically insulative layer comprises a dielectric layer that is positioned between a readout integrated circuit device and a detector.

15. The capacitor of claim 12 wherein the first plurality of vias comprise partial vias.

* * * * *